(12) United States Patent
Zundel et al.

(10) Patent No.: US 8,772,835 B2
(45) Date of Patent: Jul. 8, 2014

(54) LATERAL HIGH ELECTRON MOBILITY TRANSISTOR WITH SCHOTTKY JUNCTION

(71) Applicant: Infineon Technologies Austria AG, Villach (AT)

(72) Inventors: Markus Zundel, Egmating (DE); Franz Hirler, Isen (DE)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 13/911,437

(22) Filed: Jun. 6, 2013

(65) Prior Publication Data

US 2013/0264580 A1   Oct. 10, 2013

Related U.S. Application Data

(63) Continuation of application No. 13/090,350, filed on Apr. 20, 2011, now Pat. No. 8,482,036.

(51) Int. Cl.
*H01L 29/778* (2006.01)

(52) U.S. Cl.
USPC .................. 257/194; 257/192; 257/193

(58) Field of Classification Search
USPC .................. 257/192–194, 76, E29.246
See application file for complete search history.

(56) References Cited

U.S. PATENT DOCUMENTS

2009/0072273 A1* 3/2009 Briere ............... 257/194

* cited by examiner

*Primary Examiner* — Tran Tran
(74) *Attorney, Agent, or Firm* — Murphy, Bilak & Homiller, PLLC

(57) ABSTRACT

A lateral HEMT includes a first semiconductor layer on a second semiconductor layer, a heterojunction at an interface between the first semiconductor layer and the second semiconductor layer, and a rectifying Schottky junction. The rectifying Schottky junction has a first terminal electrically coupled to a source electrode and a second terminal electrically coupled to the second semiconductor layer.

25 Claims, 3 Drawing Sheets

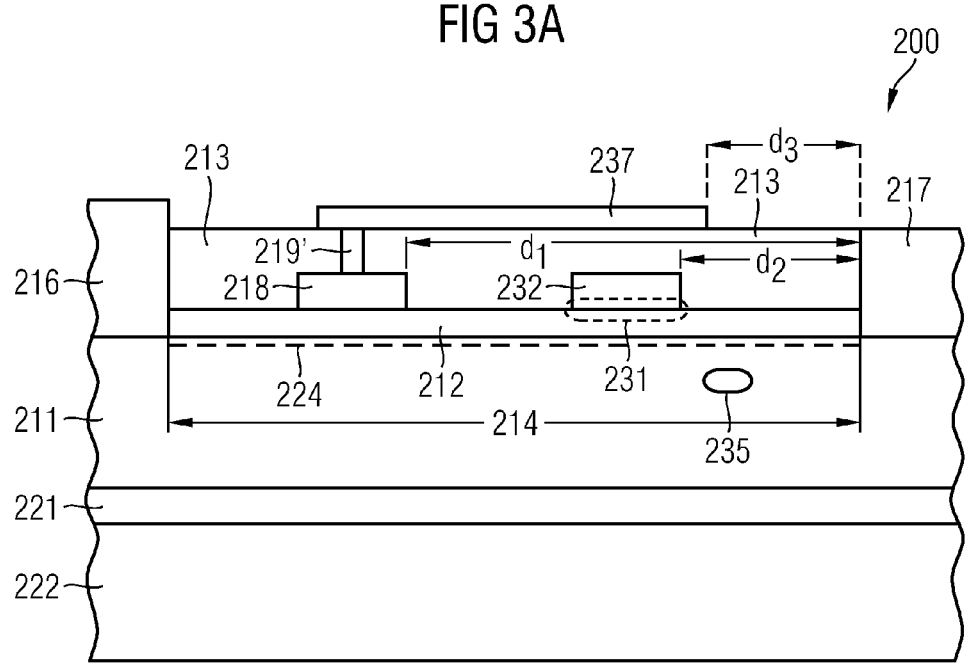
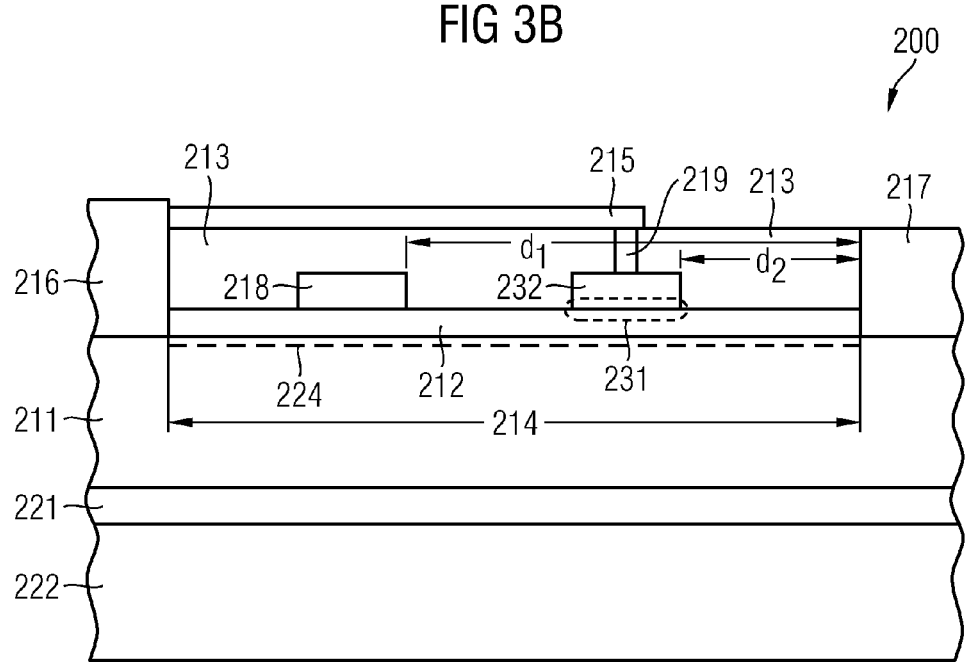

LATERAL HIGH ELECTRON MOBILITY TRANSISTOR WITH SCHOTTKY JUNCTION

PRIORITY CLAIM

This application is a Continuation of U.S. application Ser. No. 13/090,350, filed on 20 Apr. 2011, the content of said application incorporated herein by reference in its entirety.

BACKGROUND

For semiconductor devices, for example power semiconductor devices, compound semiconductors such as III-V compound semiconductors have become more and more important in recent years, since they allow for semiconductor devices with higher doping and shorter drift zone compared to silicon-based semiconductor devices while retaining a high blocking capability.

Up to now, power semiconductor devices based on III-V compound semiconductors are realized as lateral devices. These devices are known as high electron mobility transistors (HEMTs). An HEMT includes several layers of differently doped semiconductor materials with different band gaps. Due to the different band gaps of the individual layers, a two-dimensional electron gas (2DEG) is formed at the interface of these layers, the two-dimensional electron gas serving as a conductive channel. The mobility of the electrons as well as the 2D-electron charge carrier density is very high in the two-dimensional electron gas.

The two-dimensional electron gas is provided in a region between a source electrode and a drain electrode. When the HEMT is used as a switch, e.g., as a switch for inductive loads, various operation modes such as turn-off of inductive loads come up. An HEMT that meets demands on a switch operating in various modes is desirable.

SUMMARY

According to an embodiment of a lateral HEMT, the lateral HEMT includes a substrate, a first semiconductor layer above the substrate and a second semiconductor layer on the first semiconductor layer. The lateral HEMT further includes a gate electrode, a source electrode, a drain electrode and a rectifying Schottky junction. A first terminal of the rectifying Schottky junction is electrically coupled to the source electrode and a second terminal of the rectifying Schottky junction is electrically coupled to the second semiconductor layer.

According to a further embodiment of a lateral HEMT, the lateral HEMT includes a substrate, a first semiconductor layer above the substrate and a second semiconductor layer on the first semiconductor layer. The lateral HEMT further includes a gate electrode, a source electrode, a drain electrode and a Schottky junction. The Schottky junction includes a Schottky contact metal on the second semiconductor layer. The Schottky contact metal is electrically coupled to the source electrode. A shortest lateral distance between the gate electrode and the drain electrode is larger than the shortest lateral distance between the Schottky junction and the drain electrode.

According to another embodiment of a lateral HEMT, the lateral HEMT includes a substrate, a first semiconductor layer above the substrate and a second semiconductor layer on the first semiconductor layer. The lateral HEMT further includes a gate electrode, a source electrode, a drain electrode and a rectifying Schottky junction. A first terminal of the rectifying Schottky junction is electrically coupled to the source electrode and a second terminal of the rectifying Schottky junction is electrically coupled to the second semiconductor layer. The lateral HEMT further includes a passivation layer above the second semiconductor layer, a drift region having a lateral width $w_d$, and at least one field plate. The at least one field plate is arranged at least partially on the passivation layer in a region of the drift region and has a lateral width $w_f$, wherein $w_f < w_d$.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

FIG. 3A illustrates a diagrammatic cross-section through a section of a lateral HEMT including a rectifying junction and a field plate according to an embodiment.

FIG. 3B illustrates a diagrammatic cross-section through another section of the lateral HEMT illustrated in FIG. 3A.

DETAILED DESCRIPTION

Figure 1:
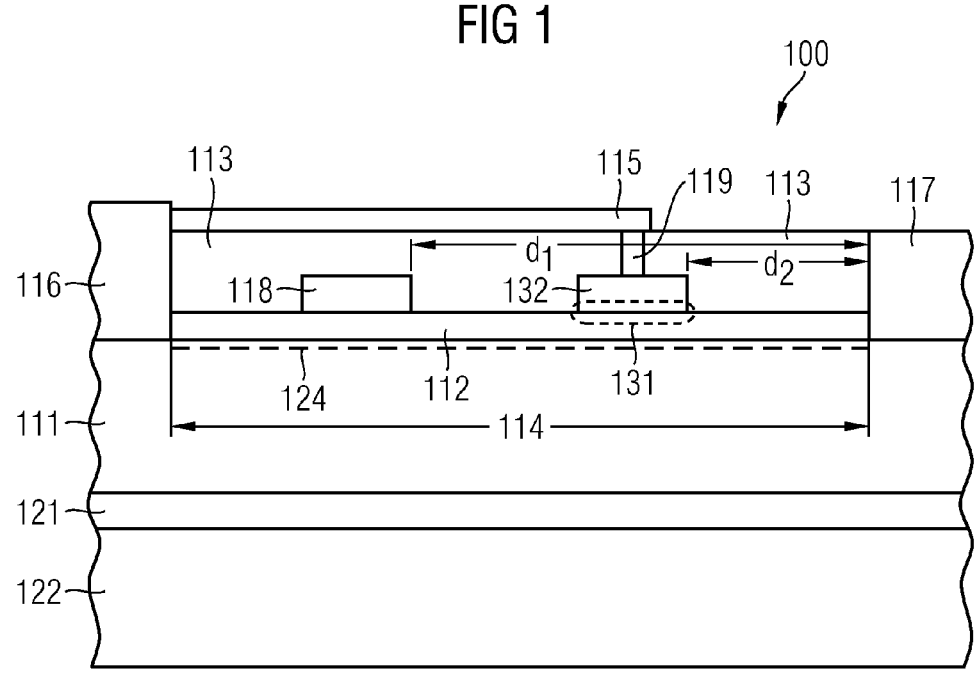
FIG. 1 illustrates a diagrammatic cross-section through a section of a lateral HEMT including a rectifying junction according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or carrier.

As employed in this specification, the terms "coupled" and/or "electrically coupled" are not meant to mean that the elements must be directly coupled together—intervening elements may be provided between the "coupled" or "electrically coupled" elements.

Spatially relative terms such as "under", "below", "lower", "over", "above", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

FIG. 1 illustrates a diagrammatic cross-section through a section of a lateral HEMT 100 according to an embodiment. In this embodiment, the lateral HEMT 100 includes a substrate 122 and a buffer layer 121 arranged on the substrate 122. The substrate 122 may include Si, SiC, GaN or $Al_2O_3$. The buffer layer 121 may include AlN, GaN or AlGaN.

In some embodiments, the buffer layer 121 includes a plurality of individual layers, and each of the individual layers may include AlN, GaN or AlGaN. Depending on the requirements of the lateral HEMT 100, a suitable buffer layer 121 may therefore be provided.

According to other embodiments, the substrate 122 or the combination of the substrate 122 and the buffer layer 121 may be a metal carrier such as a Cu carrier. A thickness of the metal carrier may be appropriately chosen to provide mechanical stability to the layer stack arranged thereon. In addition, the metal carrier supports dissipation of heat generated in the device arranged thereon in an operation mode of the device. As an example, the thickness of a metal carrier made of Cu may be between 15 μm to 50 μm, in particular between 30 μm to 40 μm. Omitting the buffer layer 121 may improve heat dissipation since this buffer layer which supports growth of GaN layers on initial silicon substrates may decrease heat dissipation due to a high thermal boundary resistance. The metal carrier may be formed by first removing a transitional carrier such as a carrier made of Si, SiC or $Al_2O_3$, e.g., by grinding or etching. Removal of the transitional carrier may be purely mechanical with a stop on a buffer layer or may start with a mechanical removal process followed by an etching process. Then, the buffer layer 121 is removed, e.g., by plasma etching, and a seed layer and/or ohmic contact layer, e.g., a single layer or layer stack is formed followed by a thickening with a metal and/or a metal alloy to end up with the metal carrier. During the formation of the metal carrier at a rear side of the work piece, i.e., chip in process, the work piece may be mechanically fixed to another carrier via a front side.

In the embodiment illustrated in FIG. 1, a first semiconductor layer 111 is arranged on the buffer layer 121. A second semiconductor layer 112 is at least partially arranged on the first semiconductor layer 111. In the illustrated embodiment, the first semiconductor layer 111 includes lightly n-doped GaN, which is typically depleted by fixed charges at the interface or which is lightly n-conducting and contains deep traps to reduce the concentration of free charge carriers and the second semiconductor layer 112 includes AlGaN. The AlGaN of the second semiconductor layer 112 is typically compensated, i.e., it has no free charge carriers and is therefore electrically insulating. At the interface between the first semiconductor layer 111 and the second semiconductor layer 112, which form a heterojunction, a two-dimensional electron gas (2DEG) is formed, which is schematically illustrated in FIG. 1 by a dashed line 124.

The lateral HEMT 100 further includes a source electrode 116, a drain electrode 117 and a gate electrode 118. In the illustrated embodiment, the source electrode 116 and the drain electrode 117 are each arranged on the first semiconductor layer 111. In other embodiments, the source electrode 116 and the drain electrode 117 are each arranged on the second semiconductor layer 112 and the two-dimensional electron gas is electrically contacted by alloying the source electrode 116 and the drain electrode 117 into the second semiconductor layer 112. The source electrode 116 and the drain electrode 117 electrically contact the first semiconductor layer 111, the second semiconductor layer 112 and the two-dimensional electron gas.

Between the source electrode 116 and the drain electrode 117, a drift region 114 is provided in the region of the two-dimensional electron gas. The gate electrode 118 is arranged on the second semiconductor layer 112 in a region between the source electrode 116 and the drain electrode 117 or in some embodiments may be at least partially recessed into the second semiconductor layer 112 for normally-off devices.

A passivation layer 113 is arranged on the second layer 112 and at least partially surrounds the gate electrode 118. By way of example, the passivation layer 113 may include a material selected from the group of $Si_xN_y$, $SiO_2$ and $Al_2O_3$.

The gate electrode 118 is configured to control the conductivity between the source electrode 116 and the drain electrode 117 of the lateral HEMT 100 by a suitable voltage applied to the gate electrode 118. The source electrode 116, the drain electrode 117 and the gate electrode 118 include an electrically conductive material, for example a metal or highly doped polysilicon.

The lateral HEMT 100 further includes a rectifying junction. In the illustrated embodiment, the rectifying junction is a Schottky junction 131 including the second semiconductor layer 112 and a Schottky contact metal 132 on the second semiconductor layer 112. By way of example, the Schottky contact metal 132 may include at least one of Ni, Pt, W, Mo, $TiSi_2$, $WSi_2$, $CoSi_2$. Formation of the Schottky junction 131 may include ion implantation, e.g., $CF_4$ plasma ion implantation, before formation of the Schottky contact metal 132. According to yet another embodiment, the rectifying junction of the lateral HEMT 100 includes a semiconductor band discontinuity induced by semiconductor materials on the second semiconductor layer 112 that have a work function different from the work function of the material of the second semiconductor layer 112.

The Schottky contact metal 132 is electrically coupled to the source electrode 116 via a trough contact 119 and a wiring 115. The wiring 115 is arranged at least partially on the passivation layer 113 in a region of the drift region 114. The wiring 115 includes an electrically conductive material such as a metal or highly doped polysilicon. By way of example, the wiring 115 may be a part of a patterned metal layer or metal alloy layer such as a layer or layer stack including Al, AlSi, AlTi, AlCu, AlSiTi, AlSiCu, Cu.

The through contact 119 is arranged between the wiring 115 and the Schottky contact metal 132 in a region of the passivation layer 113 and directly contacts both the wiring 115 and the Schottky contact metal 132. The through contact 119 includes an electrically conductive material, for example a metal or highly doped polysilicon.

The gate electrode 118 is electrically coupled to a gate supply in a region other than the region illustrated in the diagrammatic cross-section of FIG. 1. By way of example, the gate electrode 118 may be electrically coupled to the gate supply in a peripheral region of the lateral HEMT 100, e.g., outside of the drift region 114. By way of example, the gate electrode 118 may be electrically coupled to the gate supply via a through contact and a wiring formed which may be processed together with the through contact 119 and the wiring 115, respectively.

A shortest lateral distance between the gate electrode 118 and the drain electrode 117 is denoted as $d_1$. A shortest lateral distance between the rectifying junction, i.e., the Schottky contact metal 132, and the drain electrode 117 is denoted as $d_2$. In the embodiment illustrated in FIG. 1, the shortest lateral distance $d_1$ between the gate electrode 118 and the drain electrode 117 is larger than the shortest lateral distance $d_2$ between the rectifying junction and the drain electrode 117, i.e., a relation $d_1 > d_2$ holds.

In the embodiment illustrated in FIG. 1, the gate electrode 118 and the Schottky contact metal 132 of the rectifying junction are separate parts of a same patterned metal layer. Apart from the gate electrode 118 and the Schottky contact metal 132, other parts of this same pattered metal layer may be present in regions different from the region illustrated in the diagrammatic cross-section of FIG. 1. The metal layer may be patterned by lithography, e.g., by deposition of a resin, followed by exposure of the resin via a mask, development of the exposed resin, and etching of the resin to transfer a pattern of the mask into the metal layer.

The rectifying junction of the lateral HEMT 100 constitutes a counterpart of a so-called body diode between body and drain of a known Metal Oxide Semiconductor Field Effect Transistor (MOSFET), e.g., a Si MOSFET. Thus, the rectifying junction improves the operability of the lateral HEMT when switching inductive loads, for example. Further benefits of the lateral HEMT 100 include an improved robustness at high voltages during operation such as in avalanche mode, discharge of high currents to source and avoidance of discharge to a gate or to gate driver circuits, and avoidance of a voltage shift of a threshold voltage $V_{th}$ by charge trapping at the gate.

Figure 2:
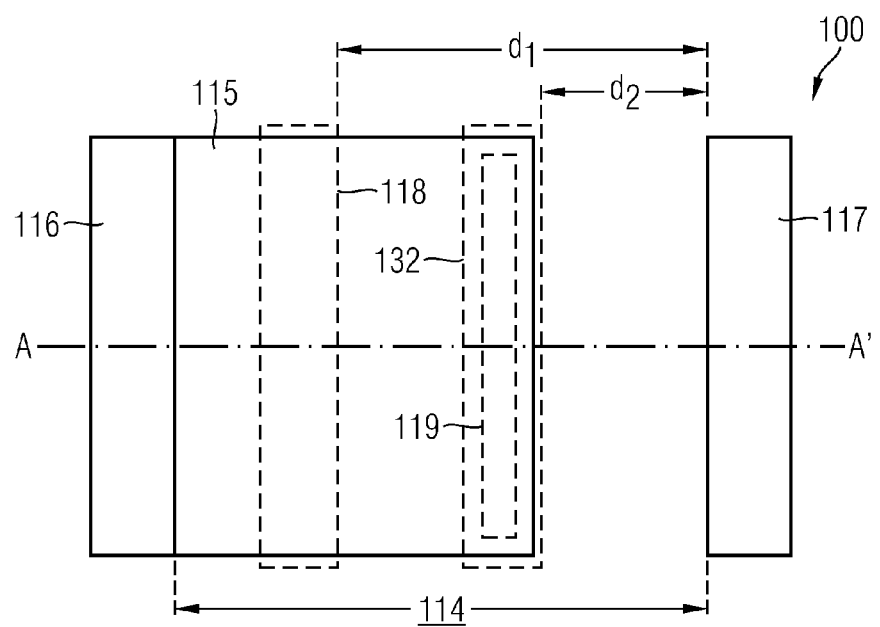
FIG. 2 illustrates a diagrammatic plan view of a section of the lateral HEMT illustrated in FIG. 1.

FIG. 2 illustrates a diagrammatic plan view of a section of the lateral HEMT 100 illustrated in FIG. 1. Components of the same function as those in FIG. 1 are identified by the same reference numbers and are not explained again below. The cross-section illustrated in FIG. 1 is taken along the line A-A' illustrated in FIG. 2.

The gate electrode 118 of the lateral HEMT 100 is arranged in a vertically lower layer which cannot be seen in the top view of FIG. 2, and is therefore illustrated by a dashed line. Likewise, the Schottky contact metal 132 is arranged in a vertically lower layer which cannot be seen in the top view of FIG. 2, and is therefore illustrated by another dashed line. Similarly, the through contact 119 is arranged in a vertically lower layer which cannot be seen in the top view of FIG. 2, and is therefore illustrated by yet another dashed line.

In the embodiment illustrated in FIG. 2, the source electrode 116, the drain electrode 117, the gate electrode 118 and the rectifying junction are shaped as stripes extending parallel to each other. The drift region 114 extends between the source electrode 116 and the drain electrode 117. The Schottky contact metal 132 is electrically coupled to the source electrode 116 via the through contact 119 and the wiring 115.

The shortest lateral distance $d_1$ between the gate electrode 118 and the drain electrode 117 is larger than the shortest lateral distance $d_2$ between the rectifying junction and the drain electrode 117, i.e., a relation $d_1 > d_2$ holds.

In other embodiments, the source electrode 116, the drain electrode 117, the gate electrode 118 and the rectifying junction or at least part of these elements are shaped different from a stripe. By way of example, ring shape and/or polygonal shape may also be applied.

FIG. 3A illustrates a diagrammatic cross-section through a section of a lateral HEMT 200 according to another embodiment. Similar to the lateral HEMT 100 illustrated in FIG. 1, the lateral HEMT 200 includes a substrate 222, a buffer layer 221, a first semiconductor layer 211, a second semiconductor layer 212, a two-dimensional electron gas schematically illustrated by a dashed line 224, a source electrode 216, a drain electrode 217, a gate electrode 218, a rectifying junction in the form of a Schottky junction illustrated by a dashed line 231, a Schottky contact metal 232, a passivation layer 213 and a drift region 214 between the source electrode 216 and the drain electrode 217.

The diagrammatic cross-section of the embodiment illustrated in FIG. 3A further includes at least one field plate 237. The at least one field plate 237 is arranged at least partially on the passivation layer 213 in a region of the drift region 214. The at least one field plate 237 includes an electrically conductive material such as a metal or highly doped polysilicon. By way of example, the at least one field plate 237 may be a part of a patterned metal layer or metal alloy layer such as a layer or layer stack including Al, AlSi, AlTi, AlCu, AlSiTi, AlSiCu, Cu. In the illustrated embodiment, the at least one field plate 237 is electrically coupled to the gate electrode 218 via a through contact 219'. The through contact 219' is arranged between the at least one field plate 237 and the gate electrode 218 in a region of the passivation layer 213 and directly contacts both the at least one field plate 237 and the gate electrode 218. The through contact 219' includes an electrically conductive material, for example a metal or highly doped polysilicon.

In the embodiment illustrated in FIG. 3A, a shortest lateral distance $d_2$ between the Schottky contact metal 232 of the rectifying junction and the drain electrode 217 is larger than a shortest lateral distance $d_3$ between the at least one field plate 237 and the drain electrode 217, i.e., a relation $d_2 > d_3$ holds.

As illustrated schematically in FIG. 3A, when the lateral HEMT 200 is reverse-biased, a region 235 in which breakdown occurs may be pinned toward the ends of the field plates 237 which are laterally closer to the drain electrode 217. The two-dimensional electron gas is deteriorated locally in these regions 235 of the drift region 214 by hot carriers. However, in the remaining regions of the drift region 214, the electric field strength may be sufficiently lowered to avoid breakdown in these regions and thus to avoid a deterioration of the two-dimensional electron gas in these regions. Thus, when the lateral HEMT 200 is in a conductive mode, the two-dimensional electron gas and hence a conductive channel may be provided in a large area of the drift region 214.

FIG. 3B illustrates another diagrammatic cross-section through a section of the lateral HEMT 200. The cross-section the lateral HEMT 200 illustrated in FIG. 3B is similar to the cross-section the lateral HEMT 100 illustrated in FIG. 1. Thus, reference is drawn to the description related to FIG. 1.

A pattern of a wiring 215 electrically coupling the Schottky contact metal 232 to the source electrode 216 may correspond to fingers of a comb-shaped structure including the source electrode 216 and the plurality of fingers.

Figure 4:
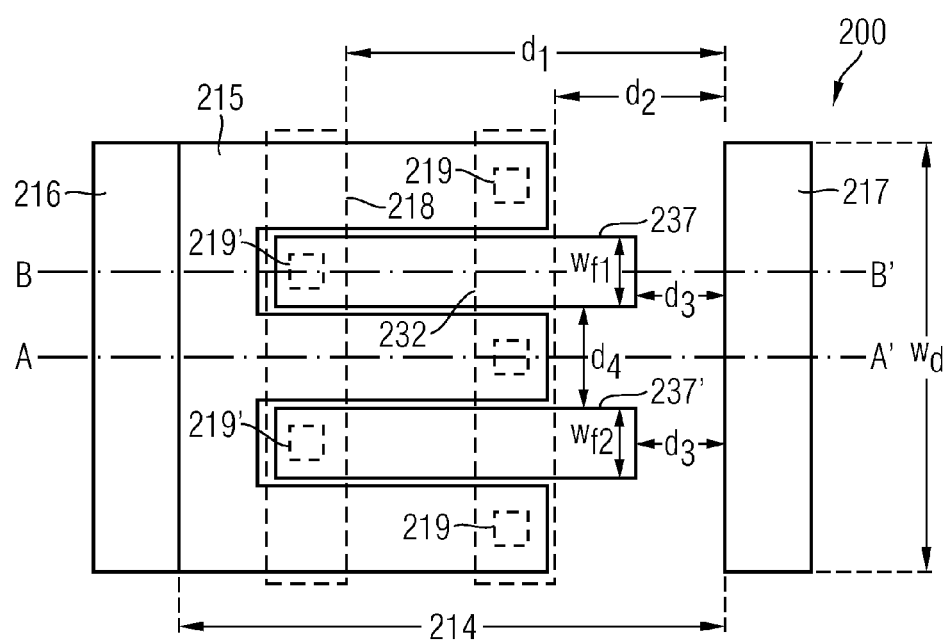
FIG. 4 illustrates a diagrammatic plan view of a section of the lateral HEMT illustrated in FIGS. 3A and 3B.

FIG. 4 illustrates a diagrammatic plan view of a section of the lateral HEMT 200 illustrated in FIGS. 3A and 3B. Components of the same function as those in FIGS. 3A and 3B are identified by the same reference numbers and are not explained again below. The cross-section illustrated in FIG. 3A is taken along the line B-B' illustrated in FIG. 4 and the cross-section in FIG. 3B is taken along the line A-A' illustrated in FIG. 4.

The gate electrode 218 of the lateral HEMT 200 is arranged in a vertically lower layer which cannot be seen in the top view of FIG. 4, and is therefore illustrated by a dashed line. Likewise, the Schottky contact metal 232 is arranged in a vertically lower layer which cannot be seen in the top view of FIG. 4, and is therefore illustrated by another dashed line. Similarly, the through contacts 219, 219' are arranged in a vertically lower layer which cannot be seen in the top view of FIG. 4, and are therefore illustrated by yet another dashed line, respectively.

In the embodiment illustrated in FIG. 4, the source electrode 216, the drain electrode 217, the gate electrode 218 and the rectifying junction are shaped as stripes extending parallel to each other. The drift region 214 extends between the source electrode 216 and the drain electrode 217.

In the illustrated embodiment, a lateral distance between neighboring field plates 237, 237' is denoted by $d_4$. In a non-illustrated embodiment, more than two field plates are present. The distance between two neighboring field plates may be the same for all the field plates. In another non-illustrated embodiment, a first plurality of field plates includes a first lateral distance between neighboring field plates and a second lateral distance between neighboring field plates, the first lateral distance being different from the second lateral distance. In further non-illustrated embodiments, some or all lateral distances between neighboring field plates are different from one another.

In the illustrated embodiment, the lateral distance $d_3$ between a first one of the field plates 237 and the drain electrode 217 equals the lateral distance $d_3$ between a neighbor one the field plates 237' and the drain electrode 217. In a non-illustrated embodiment, these distances may be different from one another.

In the illustrated embodiment, a relation $d_2 > d_3$ applies. According to other embodiments, $d_2$ may equal $d_3$ or a relation $d_2 < d_3$ may apply.

In the embodiment illustrated in FIG. 4, a lateral width of the first field plate 237 denoted by $w_{f1}$ equals the lateral width of the neighbor field plate 237' denoted by $w_{f2}$. In other embodiments the widths $w_{f1}$ and $w_{f2}$ may differ from each other. Each of the field plates 237, 237' has a lateral width smaller than a lateral width $w_d$ of the drift region 214, i.e., $w_{f1} < w_d$ and $w_{f2} < w_d$.

In the embodiment illustrated in FIG. 4, the field plates 237, 237' are electrically coupled to the gate electrode 218. According to other embodiments, different field plates may be electrically coupled to one or different ones of the source electrode 216, the gate electrode 218, the drain electrode 217, a voltage different from the voltage of any of the source electrode 216, the gate electrode 218, the drain electrode 217. By way of example, all of the field plates may be electrically coupled to the drain electrode 217. According to another example, all of the field plates may be electrically coupled to the source electrode 216. According to yet another example, a first one or a first plurality of field plates is electrically coupled to the source electrode 216 and a second one or a second plurality of field plates is electrically coupled to the drain electrode 217.

In the embodiments illustrated in FIGS. 1 to 4, the first semiconductor layer 111, 211 includes GaN and the second semiconductor layer 112, 212 includes AlGaN and the two-dimensional electron gas is located at the interface between the first semiconductor layer 111, 211 and the second semiconductor layer 112, 212 toward the first semiconductor layer 111, 211, which is also called Ga-face polarity. The HEMT is then also called "normal HEMT". In non-illustrated embodiments, the first semiconductor layer 111, 211 includes AlGaN and the second semiconductor layer 112, 212 includes GaN. The two-dimensional electron gas is thus located at the interface between the first semiconductor layer 111, 211 and the second semiconductor layer 112, 212 toward the second layer, which is also called N-face polarity. The lateral HEMT is then also called "inverted HEMT".

In further non-illustrated embodiments, both the first semiconductor layer 111, 211 and the second semiconductor layer 112, 212 are undoped and the two-dimensional electron gas at the interface between the first semiconductor layer 111, 211 and the second semiconductor 112, 212 layer is formed due to the piezoelectric effect. The HEMT is then also called "PI-HEMT" (Polarization Induced High Electron Mobility Transistor).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A lateral HEMT, comprising:
   a first semiconductor layer on a second semiconductor layer;
   a heterojunction at an interface between the first semiconductor layer and the second semiconductor layer; and
   a rectifying Schottky junction having a first terminal electrically coupled to a source electrode and a second terminal electrically coupled to the second semiconductor layer.

2. The lateral HEMT of claim 1, wherein the second semiconductor layer is at least part of the second terminal.

3. The lateral HEMT of claim 1, wherein the second terminal includes the second semiconductor layer and the first terminal includes a Schottky contact metal of at least one of Ni, Pt, W, Mo, $TiSi_2$, $WSi_2$, and $CoSi_2$ on the second semiconductor layer.

4. The lateral HEMT of claim 1, wherein a gate electrode of the lateral HEMT and a Schottky contact metal of the Schottky junction are separate parts of the same patterned metal layer.

5. The lateral HEMT of claim 1, wherein the rectifying Schottky junction includes at least one of p-type GaN and doped polysilicon.

6. The lateral HEMT of claim 1, wherein a shortest lateral distance between a gate electrode of the lateral HEMT and a drain electrode of the lateral HEMT is larger than the shortest lateral distance between the rectifying Schottky junction and the drain electrode.

7. The lateral HEMT of claim 1, wherein the first semiconductor layer comprises AlGaN and the second semiconductor layer comprises GaN.

8. The lateral HEMT of claim 1, wherein the first semiconductor layer comprises GaN and the second semiconductor layer comprises AlGaN.

9. The lateral HEMT of claim 1, wherein the source electrode, a drain electrode of the lateral HEMT, a gate electrode of the lateral HEMT, and the rectifying junction are generally shaped as stripes extending parallel to each other.

10. The lateral HEMT of claim 1, further comprising:
a passivation layer above the second semiconductor layer;
a drift region having a lateral width $w_d$; and
at least one field plate arranged at least partially on the passivation layer in a region of the drift region and having a lateral width $w_f$, wherein $w_f < w_d$.

11. The lateral HEMT of claim 10, wherein the at least one field plate is electrically coupled to one of the source electrode, a drain electrode of the lateral HEMT, a gate electrode of the lateral HEMT, and another electrode.

12. The lateral HEMT of claim 1, further comprising a substrate made of Si, SiC, GaN or $Al_2O_3$ and at least one buffer on the substrate.

13. The lateral HEMT of claim 1, further comprising a metal carrier substrate.

14. The lateral HEMT of claim 1, further comprising a gate electrode arranged on the second semiconductor layer.

15. The lateral HEMT of claim 1, further comprising a recessed gate electrode partially extending into the second semiconductor layer.

16. The lateral HEMT of claim 1, wherein the first terminal of the rectifying Schottky junction is electrically coupled to the source electrode via a plurality of interconnection fingers which form part of a comb-shaped structure including the source electrode and the plurality of interconnection fingers.

17. A lateral HEMT, comprising:
a first semiconductor layer on a second semiconductor layer;
a heterojunction at an interface between the first semiconductor layer and the second semiconductor layer;
a Schottky junction including a Schottky contact metal on the second semiconductor layer, the Schottky contact metal being electrically coupled to a source electrode; and
wherein a shortest lateral distance between a gate electrode and a drain electrode is larger than the shortest lateral distance between the Schottky junction and the drain electrode.

18. The lateral HEMT of claim 17, further comprising:
a passivation layer above the second semiconductor layer;
a drift region having a lateral width $w_d$; and
at least one field plate arranged at least partially on the passivation layer in a region of the drift region and having a lateral width $w_f$, wherein $w_f < w_d$.

19. The lateral HEMT of claim 17, wherein the gate electrode is arranged on the second semiconductor layer.

20. The lateral HEMT of claim 17, wherein the gate electrode is a recessed gate electrode extending partially into the second semiconductor layer.

21. The lateral HEMT of claim 17, wherein a first terminal of the rectifying Schottky junction is electrically coupled to the source electrode via a plurality of interconnection fingers which form part of a comb-shaped structure including the source electrode and the plurality of interconnection fingers.

22. A lateral HEMT, comprising:
a first semiconductor layer on a second semiconductor layer;
a heterojunction at an interface between the first semiconductor layer and the second semiconductor layer;
a rectifying Schottky junction having a first terminal electrically coupled to a source electrode and a second terminal electrically coupled to the second semiconductor layer;
a passivation layer above the second semiconductor layer;
a drift region having a lateral width $w_d$; and
at least one field plate arranged at least partially on the passivation layer in a region of the drift region and having a lateral width $w_f$, wherein $w_f < w_d$.

23. The lateral HEMT of claim 22, further comprising a gate electrode arranged on the second semiconductor layer.

24. The lateral HEMT of claim 22, further comprising a recessed gate electrode partially extending into the second semiconductor layer.

25. The lateral HEMT of claim 22, wherein the first terminal of the rectifying Schottky junction is electrically coupled to the source electrode via a plurality of interconnection fingers which form part of a comb-shaped structure including the source electrode and the plurality of interconnection fingers.

* * * * *